(12) United States Patent
Chang et al.

(10) Patent No.: US 10,393,498 B2
(45) Date of Patent: Aug. 27, 2019

(54) SENSOR UNIT USING ELECTRO-ACTIVE POLYMER FOR WIRELESS TRANSMISSION/RECEPTION OF DEFORMATION INFORMATION, AND SENSOR USING SAME

(71) Applicant: CHUNG-ANG UNIVERSITY INDUSTRY-ACADEMIC COOPERATION FOUNDATION, Seoul (KR)

(72) Inventors: Seung Hwan Chang, Seoul (KR); Ji Hun Bae, Seoul (KR)

(73) Assignee: Chung-Ang University Industry-Academic Cooperation Foundation, Seoul (KR)

( * ) Notice: Subject to any disclaimer, the term of this patent is extended or adjusted under 35 U.S.C. 154(b) by 229 days.

(21) Appl. No.: 15/322,907

(22) PCT Filed: Oct. 13, 2015

(86) PCT No.: PCT/KR2015/010748
§ 371 (c)(1),
(2) Date: Dec. 29, 2016

(87) PCT Pub. No.: WO2016/060427
PCT Pub. Date: Apr. 21, 2016

(65) Prior Publication Data
US 2017/0153105 A1 Jun. 1, 2017

(30) Foreign Application Priority Data

Oct. 15, 2014 (KR) .................. 10-2014-0139158
Dec. 5, 2014 (KR) .................. 10-2014-0173598
(Continued)

(51) Int. Cl.
*H01L 41/09* (2006.01)
*H01L 41/04* (2006.01)
(Continued)

(52) U.S. Cl.
CPC .............. *G01B 7/18* (2013.01); *D03D 1/0088* (2013.01); *D03D 15/00* (2013.01);
(Continued)

(58) Field of Classification Search
CPC .......... G01B 7/18; G01B 7/16; D03D 1/0088; D03D 15/00; D03D 15/0027;
(Continued)

(56) References Cited

U.S. PATENT DOCUMENTS 7,834,527 B2  11/2010  Alvarez Icaza Rivera et al.
9,231,186 B2 *  1/2016  Busgen .................... F15D 1/12
(Continued)

FOREIGN PATENT DOCUMENTS

EP          1420094 A1    5/2004
JP       2012-046605 A    3/2012
(Continued)

*Primary Examiner* — Thomas M Dougherty
(74) *Attorney, Agent, or Firm* — Novick, Kim & Lee, PLLC; Sang Ho Lee

(57) ABSTRACT

Provided is a technique related to a new sensor unit which is flexible in that the sensor unit can be installed in various locations such as inside of a structure with a large curvature, and which can stably measure multi-directional deformation and very efficiently and wireless measure deformation information, and thus provided is a technique of a sensor structure which can be universally utilized in various systems for measuring deformation information. The sensor unit using an electro-active polymer for the wireless transmission/reception of deformation information, according to a first embodiment of the present invention, comprises: a first sensor part formed from a fiber or film comprising a ferro-
(Continued)

electric electro-active polymer material; a second sensor part configured to include the first sensor part therein, and formed from a matrix comprising a dielectric elastomer electro-active polymer material; and an electrode part provided to come into contact with the first sensor part or the second sensor part and, when an external force is applied to the first sensor part or the second sensor part, transmits to the outside an electric signal generated by the first sensor part or the second sensor part.

5 Claims, 12 Drawing Sheets

(30) Foreign Application Priority Data

Jun. 30, 2015 (KR) ........................ 10-2015-0092960
Sep. 16, 2015 (KR) ........................ 10-2015-0130683

(51) Int. Cl.
| | | |
|---|---|---|
| *G01B 7/16* | (2006.01) | |
| *D03D 15/00* | (2006.01) | |
| *G01R 19/145* | (2006.01) | |
| *G08C 17/02* | (2006.01) | |
| *D03D 1/00* | (2006.01) | |
| *H01L 41/08* | (2006.01) | |
| *H01L 41/083* | (2006.01) | |
| *H01L 41/087* | (2006.01) | |
| *H01L 41/113* | (2006.01) | |
| *H01L 41/193* | (2006.01) | |

(52) U.S. Cl.
CPC ........... *D03D 15/0027* (2013.01); *G01B 7/16* (2013.01); *G01R 19/145* (2013.01); *G08C 17/02* (2013.01); *H01L 41/082* (2013.01); *H01L 41/083* (2013.01); *H01L 41/087* (2013.01); *H01L 41/1132* (2013.01); *D10B 2401/16* (2013.01); *H01L 41/193* (2013.01)

(58) Field of Classification Search
CPC ..... G01R 19/145; G08C 17/02; H01L 41/082; H01L 41/083; H01L 41/087; H01L 41/1132; H01L 41/93; D10B 2401/16
USPC ......................................... 310/311–371, 800
See application file for complete search history.

(56) References Cited

U.S. PATENT DOCUMENTS

| | | | | |
|---|---|---|---|---|
| 2006/0122954 A1* | 6/2006 | Podlasek | ................ | G09B 23/28 221/24 |
| 2008/0129278 A1* | 6/2008 | Dai | ........................ | G01D 5/142 324/109 |
| 2010/0201384 A1* | 8/2010 | Scott-Carnell | ...... | G01M 5/0041 324/693 |
| 2011/0001398 A1* | 1/2011 | Kang | ..................... | B32B 37/10 310/363 |
| 2016/0064643 A1* | 3/2016 | Rasmussen | ........... | H01L 41/092 514/772.6 |

FOREIGN PATENT DOCUMENTS

| | | |
|---|---|---|
| KR | 10-2012-0083261 A | 7/2012 |
| KR | 10-2014-0008653 A | 1/2014 |
| KR | 10-2014-0092182 A | 7/2014 |

\* cited by examiner

SENSOR UNIT USING ELECTRO-ACTIVE POLYMER FOR WIRELESS TRANSMISSION/RECEPTION OF DEFORMATION INFORMATION, AND SENSOR USING SAME

TECHNICAL FIELD

The following embodiments relate to a sensor unit configured to include an electro-active polymer material and the structure of an electrode so as to sense, for example, deformation of a structure, etc. in a wireless and powerless manner and a sensor using the sensor unit.

BACKGROUND ART

As a deformed part of an object such as a structure, etc. including a composite material, due to energy, shock, etc., is restored by an elastic force, unlike in an existing metal structure, deformation does not appear outwardly, and the object looks like as being maintained in a normal state. However, defects, such as separation between fine layers inside the object and fine cracks, may occur. When these defects extend or continue to grow during an operation of the structure or a severe load is applied to the object due to the defects, sudden destruction and damage of the object may occur. Thus, for safety of the object, the location of a damaged part needs to be sensed at an initial stage and a proper maintenance is performed so that the object can be restored to its original state.

A technique for monitoring safety of the structure is used as a technique for checking the location of the damaged part and whether the object is damaged. Recently, development for small-sized sensors capable of monitoring the structure through the configuration of a piezoelectric (PZT) sensor and an electrode that receives an electric signal from the PZT sensor by deformation of the PZT sensor has been actively carried out.

For example, Korean Patent Laid-open Publication No. 2012-0083261 as the related art discloses a small sensor capable of monitoring a structure using a PZT sensor and an electrode applied to upper and lower parts of the PZT sensor. The PZT sensor has been regarded as an obstacle to wide utilization, in particular, installation and multi-directional deformation information measurement of the inside of a structure having a large curvature, due to its brittleness caused by a ceramic material. As a result, the utilization range of a sensor having no flexibility with respect to various external forces, such as a fiber Bragg grating (FBG) sensor and the PZT sensor, is very limited in checking and evaluation of soundness of the structure.

DETAILED DESCRIPTION OF THE INVENTION

Technical Problem

As mentioned above, in a sensor for sensing deformation information according to the related art, due to features of low flexibility and piezoelectric characteristics, it is difficult to install the sensor in various places, and only deformation in a particular direction can be measured such that multi-directional deformation information cannot be substantially measured and thus, the utilization range of the sensor is very limited, as described above.

The present invention provides a new sensor unit that is flexible such that the sensor unit may be installed in various locations such as an inside of a structure with a large curvature and that may measure multi-directional deformation stably, thereby providing a technique of a sensor structure that may be universally utilized in various systems for measuring deformation information.

The present invention also provides a technique in which flexibility and durability are sufficiently acquired and deformation information of an installed place is precisely measured without functionality in spite of various types of external forces so that the technique can be freely utilized in various systems for measuring deformation information in addition to a system for monitoring soundness of a structure.

The present invention also provides a sensor unit that may precisely measure deformation information of a structure, etc. in a wireless and powerless manner with a high power efficiency due to an increased production of power by deformation, and a technique of a sensor structure using the sensor unit.

Technical Solution

One aspect of the present invention provides a sensor unit using an electro-active polymer for wireless transmission/reception of deformation information according to a first embodiment of the present invention, the sensor unit including: a first sensor part formed in a fiber or film including a ferroelectric electro-active polymer material; a second sensor part configured to include the first sensor part, and formed in a matrix including a dielectric elastomer electro-active polymer material; and an electrode part provided to come into contact with the first sensor par or the second sensor part, and when an external force is applied to the first sensor part or the second sensor part, transmitting to the outside an electric signal generated by the first sensor part or the second sensor part.

Another aspect of the present invention provides a sensor unit using an electro-active polymer for wireless transmission/reception of deformation information according to a second embodiment of the present invention, the sensor unit including: a first electrode; a sensor part including an electro-active polymer material configured to surround the first electrode in the form of a coil; and a second electrode provided to be insulated from the first electrode and formed to surround the sensor part.

Another aspect of the present invention provides a sensor using an electro-active polymer for wireless transmission/reception of deformation information according to a third embodiment of the present invention, the sensor including: at least one first fiber including an electro-active polymer material that generates a voltage when the at least one first fiber is deformed by an external force; and at least one second fiber that is flexible and includes a conductive material, wherein the first fiber and the second fiber are woven to cross each other, or a fibrous body is formed so that a second fiber layer is formed on at least one of an inside and a surface of a first fiber layer and thus the fibrous body is woven in a form of a fabric.

Another aspect of the present invention provides a sensor unit using an electro-active polymer for wireless transmission/reception of deformation information according to a fourth embodiment of the present invention, the sensor unit including: a coil-shaped fiber coil including at least one first fiber including an electro-active polymer material that generates a voltage when the sensor is deformed by an external force and at least one second fiber formed from a conductive material; and a capacitor connected to at least a part of the fiber coil, wherein, when the generated voltage is applied to the at least one second fiber, the generated voltage is charged in or discharged from the capacitor through the second fiber so that a current flows through the at least one second fiber and as the current flows through the second fiber, an electromagnetic field is formed outside the fiber coil.

Advantageous Effects of the Invention

According to first through fourth embodiments of the present invention, when a sensor for sensing deformation information is formed using features of an electro-active polymer material that generates electrical energy when shock and deformation are applied to the sensor by an external force, a first sensor part including a ferroelectric electro-active polymer has characteristics such as high reliability and stability with respect to a fast mechanical-electrical ductility reaction speed and a mechanical-chemical mechanism and low impedance, and a second sensor part including a dielectric elastomer electro-active polymer has characteristics such as large deformation and a fast mechanical electrical ductility response speed and simultaneously has very high flexibility.

When the electro-active polymer materials having different characteristics are compositely used for two sensor parts, due to high flexibility of each of the sensor parts, the sensor may be installed in a structure with a large curvature so that limitations in an installation place may be minimized and directions of stimuli that may be sensed by the first sensor part and the second sensor part are different from each other so that multi-directional deformation may be precisely sensed.

Meanwhile, by using features of the ferroelectric electro-active polymer material that constitutes the first sensor part when a large external force is applied to the first sensor part, the second sensor part having large elongation like when the first sensor part is damaged, may function as an auxiliary sensor so that stability of a function may be greatly improved.

Meanwhile, an electro-active polymer material that may generate power by the external force and simultaneously has a fast mechanical/electrical ductility reaction speed and high reliability and stability with respect to the mechanical/chemical mechanism, and a conductive material that may produce electrical energy generated by the electro-active polymer material with high efficiency are used so that, when deformation of the structure occurs, the electrical energy may be generated by the electro-active polymer material and the conductive material and thus deformation information of the structure may be measured with high accuracy. In addition, when a fiber layer of the electro-active polymer material and a flexible conductive fiber layer are woven in the form of a fabric and are utilized in the sensor, due to a solid fabric structure, the deformation information may be precisely measured without losing functionality in spite of various external forces and simultaneously, the sensor may be installed without limitations in various places such as the surface of the structure with a large curvature or a wearable device so that a degree of freedom of installation at which the sensor may be installed anywhere in which appearance deformation measurement technology is required, may be secured.

Meanwhile, because the sensor part of a sensor unit surrounds an electrode in the form of a coil, efficiency of forming electrical energy and electromagnetic field is greatly increased and a large electromagnetic field may be transmitted even in small deformation so that limitations in an installation location of the sensor for sensing deformation information in a powerless and wireless manner and the measurement location of a measuring device may be overcome.

BEST MODE

Figure 1:
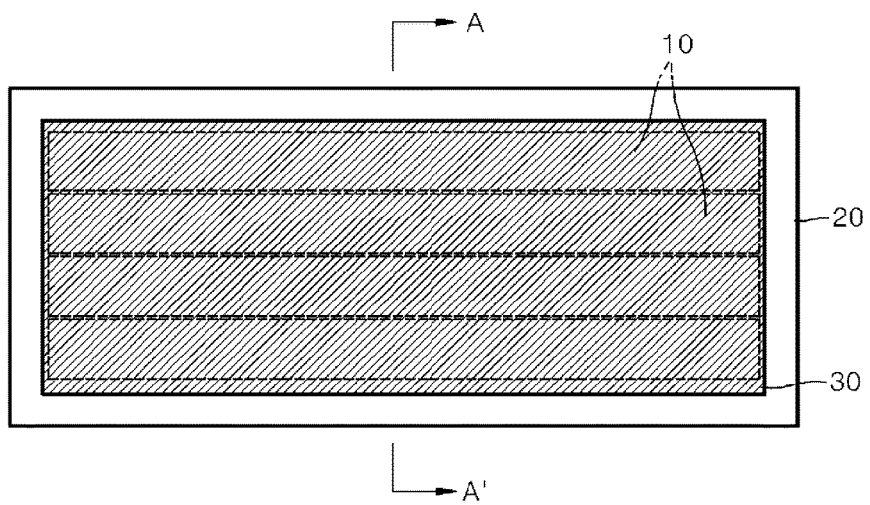
FIG. 1 is a plan view of a sensor using an electro-active polymer for wireless transmission/reception of deformation information according to a first embodiment of the present invention.

Hereinafter, a sensor unit using an electro-active polymer for wireless transmission/reception of deformation information according to first through fourth embodiments of the present invention and a sensor using the sensor unit will be described in detail with reference to the attached drawings.

For clear understanding of the present invention in the following description, descriptions of well-known technology of features of the present invention will be omitted. It is obvious that the following embodiments are detailed descriptions for helping understanding of the present invention and do not limit the scope of the present invention. Thus, an equivalent invention for performing the same function as that of the present invention is also within the scope of the present invention.

Like reference numerals in the following description denote like elements, and unnecessary and redundant descriptions and descriptions of the well-known technology will be omitted. Also, redundant descriptions of each of the following embodiments of the present invention with descriptions of a background art of the present invention will also be omitted.

Also, descriptions of first through fourth embodiments of the present invention may be the same and redundant. However, each of the embodiments may be independently implemented, and although configurations having the same names but having different identifications numbers or mentioned in different embodiments will be understood as different technical configurations.

[First Embodiment]

FIG. 1 is a plan view of a sensor using an electro-active polymer for wireless transmission/reception of deformation information according to a first embodiment of the present invention.

Referring to FIG. 1, the sensor using the electro-active polymer for wireless transmission/reception of deformation information the present embodiment includes a first sensor part 10, a second sensor part 20, and an electrode part 30.

The first sensor part 10 refers to a sensor unit having a fiber shape including an electro-active polymer material that works in a ferroelectric behavior principle. A ferroelectric electro-active polymer has excellent characteristics for being utilized for a sensor for sensing deformation, such as fast mechanical/electrical ductility reaction speed (several m seconds to seconds), high reliability and stability with respect to mechanical/chemical behavior and low impedance, etc. The first sensor part 10 may be a polyvinylidene fluoride (PVDF), for example. However, embodiments are not limited thereto.

The second sensor part 20 refers to a sensor part configured to include the first sensor part 10 therein and formed from a matrix including a dielectric elastomer electro-active polymer material.

A dielectric elastomer electro-active polymer is silicone, for example, has characteristics for being utilized for a sensor due to fast mechanical/electrical ductility reaction speed and a linear electrical reaction against a mechanical stimulus and has high flexibility.

Thus, the second sensor part 20 includes the dielectric elastomer electro-active polymer and includes the first sensor part 10 therein. Thus, the second sensor part 20 assists with alignment of the first sensor part 10 that is a fiber including the ferroelectric electro-active polymer and functions as an insulator for securing electrical stability and simultaneously may serve as an auxiliary sensor when the first sensor part 10 is not capable of performing any function (for example, a short-circuit, etc.) due to a large external force (for example, a one-direction deformation rate of about 5% or more).

Meanwhile, in order to maximize performing of functions of the first sensor part 10 and the second sensor part 20, directions of external forces by which the first sensor part 10 and the second sensor part 20 generate electric signals, may be different from each other. Thus, the second sensor part 20 serves as simply an auxiliary sensor, as mentioned above and is configured to sense deformation of a direction different from a deformation direction sensed by the first sensor part 10 so that the effect of measuring various deformation may be attained.

The electrode part 30 is installed to come into contact with the first sensor part 10 or the second sensor part 20 and performs a function in which, when the function of the first sensor part 10 or the second sensor part 20 is performed, i.e., when an external force is applied to the first sensor part 10 or the second sensor part 20, an electric signal generated by the first sensor part 10 or the second sensor part 20 is transmitted to the electrode part 30 and the electrode part transmits the electric signal to an external measuring device to sense deformation information. A specific installation example of the electrode part 30 and configuration examples of the first sensor part 10 and the second sensor part 20 are shown in FIGS. 2 and 3.

Figure 2:
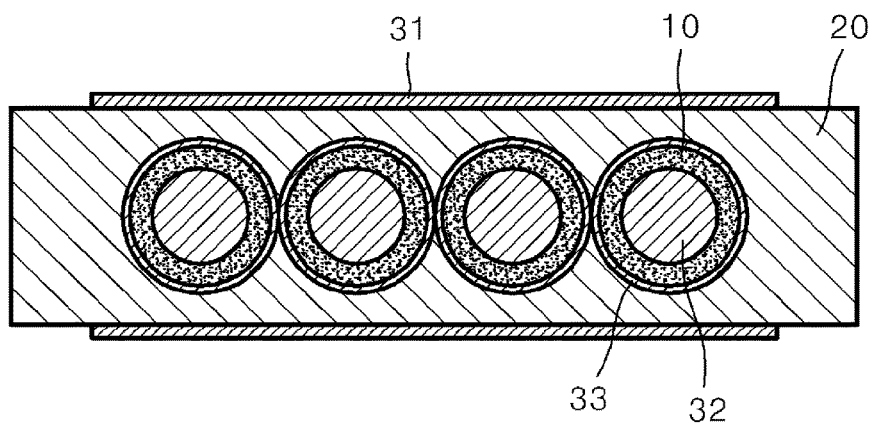
FIGS. 2 and 3 are cross-sectional views for describing each of examples taken along line A-A' of FIG. 1.
Figure 3:
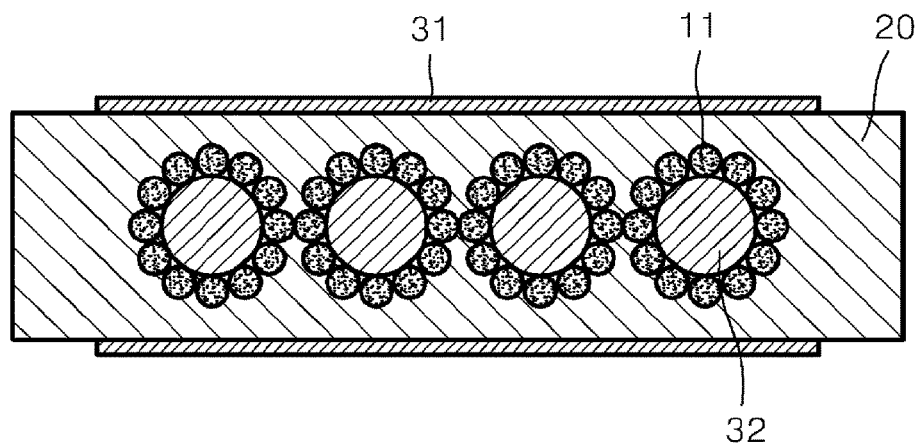

FIGS. 2 and 3 are cross-sectional views for describing each of examples taken along line A-A' of FIG. 1.

First, referring to the cross-sectional view of FIG. 2, a part 32 of the electrode part is configured to be inserted into an inside of a fiber that is the first sensor part 10, and the second sensor part 20 is formed from a matrix that surrounds the first sensor part 10. The other part 31 of the electrode part comes into contact with an outside of the second sensor part 20. Also, another electrode part 33 may be applied onto an outside surface of the first sensor part 10 so as to transmit an electric signal. The electrode parts 31, 32, and 33 may be insulated from one another so that deformation direction and size may be precisely measured using the transmitted electric signal.

Meanwhile, referring to the cross-sectional view of FIG. 3, the first sensor part is configured to include a plurality of fiber bundles 11, unlike in FIG. 2. In this case, the part 32 of the electrode part may be surrounded by the plurality of fiber bundles 11. Except for that, the second sensor part 20 and the other part 31 of the electrode part are formed in the same way as that of FIG. 2.

Through this configuration, the second sensor part 20 assists with alignment of the first sensor parts 10 and 11. The electrode parts 31 and 32 are insulated from each other, and when each of the electrode parts 31 and 32 comes into contact with the first sensor parts 10 and 11 or the second sensor part 20 and an external force is applied to the first sensor parts 10 and 11 or the second sensor part 20, the electrode parts 31 and 32 may perform a function of precisely transmitting electric signals generated by the first sensor parts 10 and 11 and the second sensor part 20.

In addition, the sensor according to the first embodiment of the present invention may be installed in a complicated structure, in particular, a structure having a very large curvature using features having high flexibility of the first sensor parts 10 and 11 and the second sensor part 20.

Meanwhile, even though the first sensor parts 10 and 11 are damaged by a large external force applied thereto from the outside due to high elongation of the second sensor part 20, the second sensor part 20 may serve as an auxiliary sensor so that the sensor according to the first embodiment of the present invention may increase a maintenance power in terms of maintenance caused by an external force.

Figure 4:
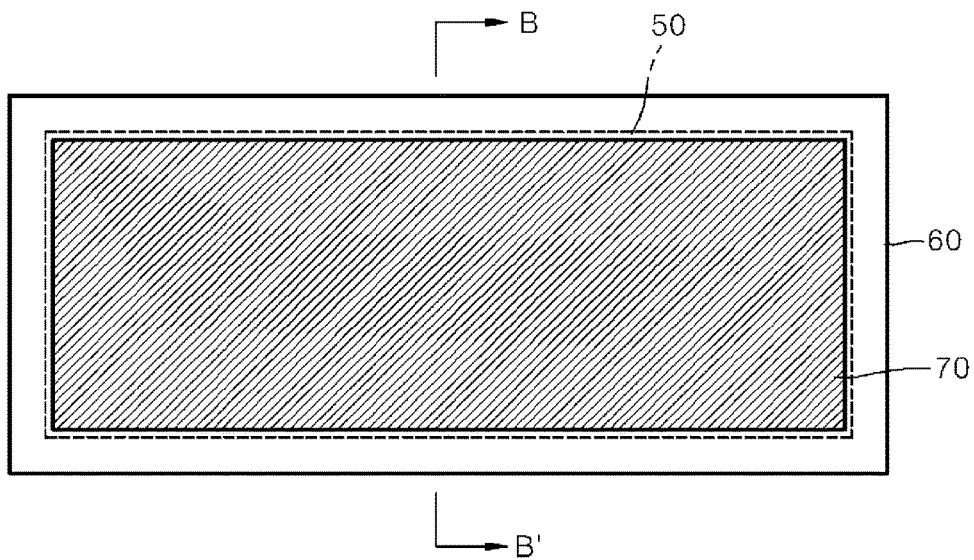
FIG. 4 is a plan view of a sensor using an electro-active polymer for wireless transmission/reception of deformation information according to another example of the first embodiment of the present invention.

FIG. 4 is a plan view of a sensor using an electro-active polymer for wireless transmission/reception of deformation information according to another example of the first embodiment of the present invention. Because, in the following description, the examples mentioned in descriptions of FIGS. 1 through 3 and examples in descriptions of FIGS. 4 through 6 will be understood as independent inventions, although the same configurations are mentioned, they will be understood as different technical features. However, unnecessary descriptions of a redundant concept with mentioned parts in the descriptions of FIGS. 1 through 3 will be omitted.

Referring to FIG. 4, the sensor using the electro-active polymer for wireless transmission/reception of deformation information according to another example of the first embodiment of the present invention includes a first sensor part 50, a second sensor part 60, and an electrode part 70.

The first sensor part 50 is configured to include the above-mentioned ferroelectric electro-active polymer material and is formed from a film, unlike in the embodiment of FIGS. 1 through 3.

The second sensor part 60 is configured to include the first sensor part 50 therein, is formed from a matrix including a dielectric elastomer electro-active polymer material and means the same configuration as that of the first embodiment.

The electrode part 70 comes into contact with the first sensor part 50 or the second sensor part 60, like in the descriptions of the embodiment of FIGS. 1 through 3, and when the function of the first sensor part 50 or the second sensor part 60 is performed, i.e., when an external force is applied to the first sensor part 50 or the second sensor part 60, the electrode part 70 performs a function of receiving an electric signal generated by the first sensor part 50 or the second sensor part 60 and transmitting the electric signal to an external measuring device to transmit deformation information.

In the same concept as that of the embodiment of FIGS. 1 through 3, directions of external forces by which the first sensor part 50 and the second sensor part 60 generate electric signals, may be different from each other.

Figure 5:
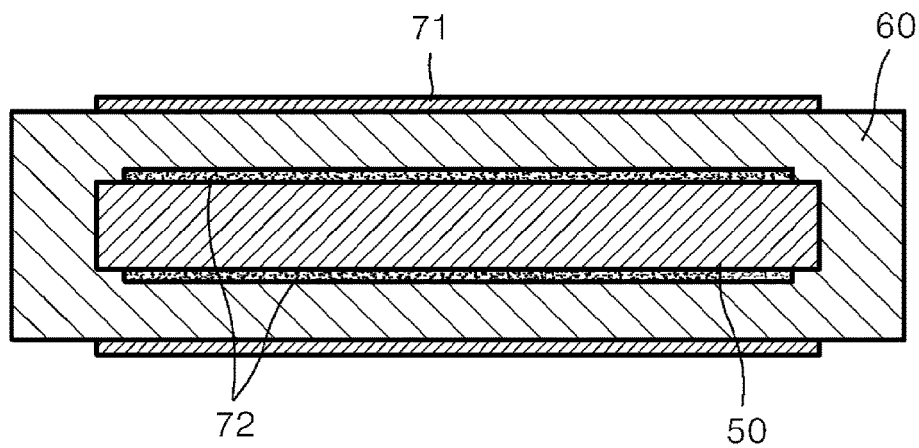
FIGS. 5 and 6 are cross-sectional views for describing each of examples taken along line B-B' of FIG. 1.
Figure 6:
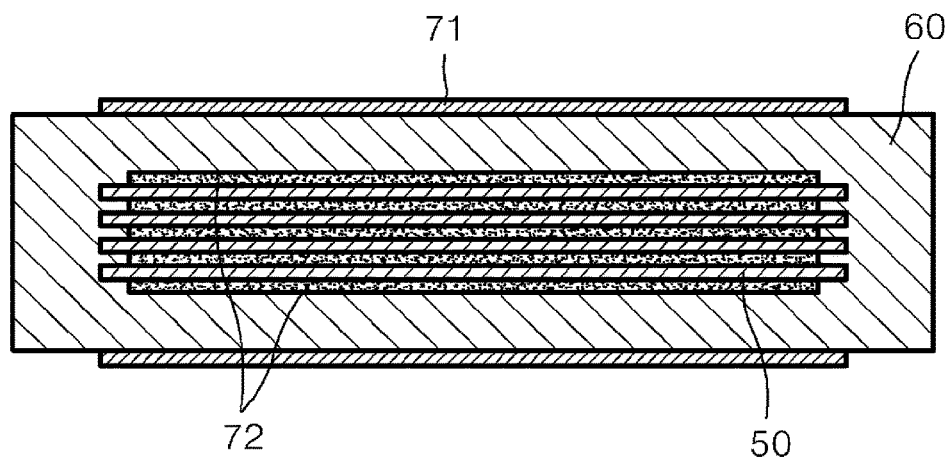

The embodiment of FIGS. 4 through 6 of the present invention and the embodiment of FIGS. 1 through 3 are clearly distinguished from each other, and a view for describing a specific installation example of the electrode part 70 and configuration examples of the first sensor part 50 and the second sensor part 60 are shown in FIGS. 5 and 6.

FIGS. 5 and 6 are cross-sectional views for describing each of examples taken along line B-B' of FIG. 4.

First, referring to the example of FIG. 5, the first sensor part 50 is formed to have a shape of a film that constitutes a one layer. Meanwhile, a part 72 of an electrode comes into contact with the first sensor part 50, as mentioned in the descriptions of the embodiment of FIGS. 1 through 3, and the second sensor part 60 is formed to have a structure of a matrix that surrounds the first sensor part 50.

The other part 71 of the electrode part may also come into contact with the second sensor part 60, like in the descriptions of the embodiment of FIGS. 1 through 3. Of course, as mentioned above, the parts 71 and 72 of the electrode part are insulated from each other so that deformation direction and size of deformation information may be precisely measured.

Meanwhile, referring to the example of FIG. 6, the first sensor part 50 may be formed to have a layer stack of a plurality of layers 51, unlike in the example of FIG. 5. The part 72 of the electrode part may also be configured to be inserted into each of stack structures.

Meanwhile, the second sensor part 60 and the other part 71 of the electrode part may have the same configuration as that of the example of FIG. 5.

Figure 7:
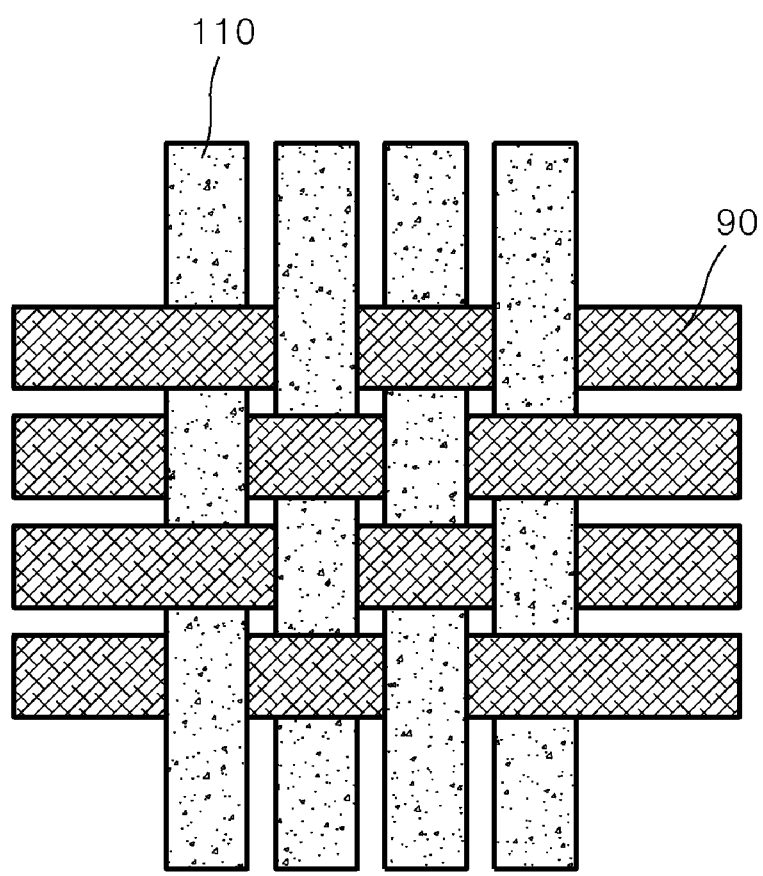
FIG. 7 illustrates an example of a configuration view of a sensor using an electro-active polymer for wireless transmission/reception of deformation information according to another example of the first embodiment of the present invention.

FIG. 7 illustrates an example of a configuration view of a sensor using an electro-active polymer for wireless transmission/reception of deformation information according to another example of the first embodiment of the present invention. Because, in the following description, the examples of FIGS. 1 through 6 and examples of FIGS. 7 and 8 of the present invention will be understood as independent inventions, although the same configurations are mentioned, they will be understood as different technical features. However, unnecessary descriptions of a redundant concept with mentioned parts in the descriptions of FIGS. 1 through 6 will be omitted.

Referring to FIG. 7, the sensor using the electro-active polymer for wireless transmission/reception of deformation information according to another example of the first embodiment of the present invention includes a first sensor part 90, a second sensor part 100, and an electrode part (not shown), wherein, as illustrated in FIG. 7, a fiber that constitutes the first sensor part 90 and the second sensor part 100 has a shape of plain weave, twill, satin, or a hybrid fabric thereof.

That is, in the example illustrated in FIG. 7, the first sensor part 90 and the second sensor part 100 are formed from a fiber, fiber bundles or a film having a small width. Of course, in the same concept as that of the examples of FIGS. 1 through 6, directions of external forces by which the first sensor part 90 and the second sensor part 100 generate electric signals, may be different from each other.

Figure 8:
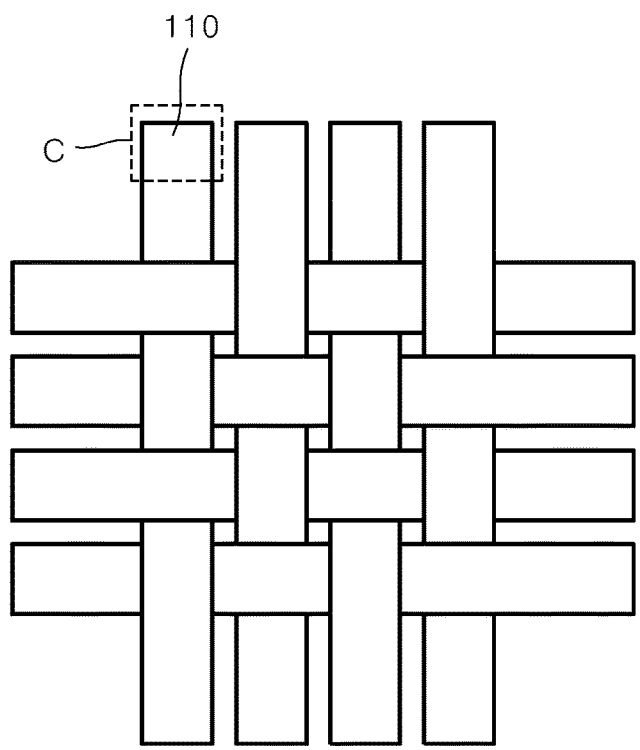
FIG. 8 illustrates an example of a configuration of a sensor using an electro-active polymer for wireless transmission/reception of deformation information according to another example of the first embodiment of the present invention.

In the examples of FIGS. 7 and 8, the electrode part may be formed to perform the same function as that in the descriptions of the examples of FIGS. 1 through 6. Of course, a configuration for insulation between an electrode part coming into contact with the first sensor part 90 and an electrode part coming into contact with the second sensor part 100 may be included in the electrode part.

For example, the electrode part may be configured to be inserted into the fiber that constitutes the first sensor part 90 and the second sensor part 100 or to be applied onto outer surfaces of the first sensor part 90 and the second sensor part 100 and to have an insulating layer applied onto an outer surface of the electrode part. Besides, any configuration for insulating the electrode parts from each other and performing the function of the electrode part may be used.

Meanwhile, in FIG. 7, the first sensor part 90 and the second sensor part 100 are separately configured. However, the example of FIG. 7 may be modified, as illustrated in FIG. 8.

FIG. 8 illustrates an example of a configuration of a sensor using an electro-active polymer for wireless transmission/reception of deformation information according to another example of the first embodiment of the present invention.

Referring to FIG. 8, the sensor using the electro-active polymer for wireless transmission/reception of deformation information according to another example of the first embodiment of the present invention is configured to include a sensor unit 110 including a sensor part formed from of one kind of a fiber so that the corresponding fiber, i.e., the sensor unit 110 is configured to have a shape of plain weave, twill, satin, or a hybrid fabric thereof.

A structure C of this fiber may be the structure described in the descriptions of FIGS. 1 and 4. That is, the structure of a first sensor part, a second sensor part and an electrode is formed, as illustrated in FIGS. 1 and 4, thereby constituting one sensor unit 110.

That is, the sensor unit 110 may include the first sensor part formed from one of a fiber including a ferroelectric electro-active polymer material and a film, the second sensor part configured to include the first sensor part therein and formed from a matrix including a dielectric elastomer electro-active polymer material, and an electrode part provided to come into contact with the first sensor part or the second sensor part and, when an external force is applied to the first sensor part or the second sensor part, transmitting to the outside an electric signal generated by the first sensor part or the second sensor part, as illustrated in FIGS. 1 and 4.

According to the above example, one sensor unit 110 is formed to have a fiber shape, and the corresponding fiber has a shape of a fabric so that flexibility may be further improved.

In this way, the sensor unit manufactured in the example of FIGS. 7 and 8 has remarkably improved flexibility and thus may be installed in more various structures.

[Second Embodiment]

Figure 9:
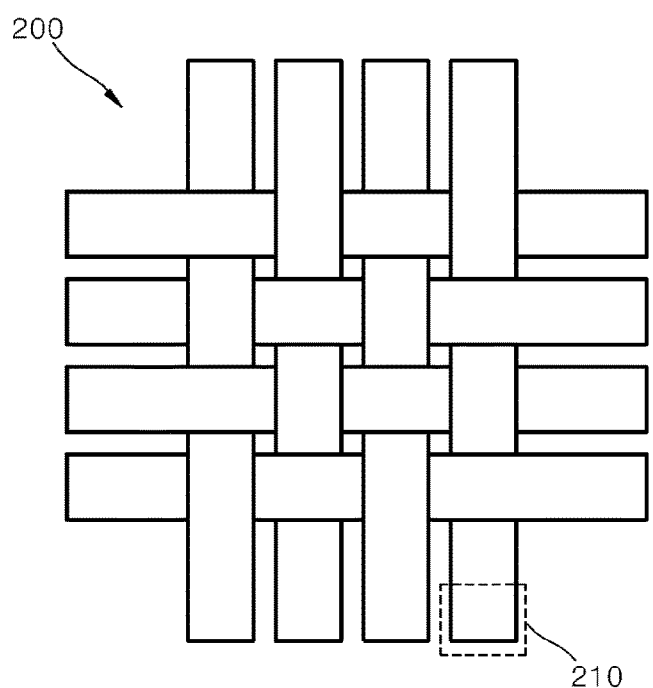
FIG. 9 illustrates an example of a structure of a sensor using an electro-active polymer for wireless transmission/reception of deformation information according to a second embodiment of the present invention.

FIG. 9 illustrates an example of a structure of a sensor using an electro-active polymer for wireless transmission/reception of deformation information according to an embodiment of the present invention.

Referring to FIG. 9, a fabric sensor 200 (hereinafter, referred to as a sensor) using the electro-active polymer for wireless transmission/reception of deformation information according to an embodiment of the present invention is characterized by an electro-active polymer fiber coil sensor unit 210 (hereinafter, referred to as a sensor unit) for wireless transmission/reception of deformation information having a shape of a particular fiber yarn, as illustrated in FIG. 9, woven in the form of a fabric.

As will be described below, the sensor unit 210 includes a sensor part including an electro-active polymer material and an electrode. The sensor unit 210 is formed to have a shape of a fiber yarn. Thus, the sensor unit 210 is woven in a fabric according to various weaving methods (plain weave, twill, satin, and a hybrid shape thereof), thereby constituting the sensor 200.

To this end, the electro-active polymer material included in the electrode and the sensor part included in the sensor unit 210 may have dielectric elastomer characteristics. However, embodiments are not limited thereto. For example, an electro-active polymer may be formed from silicone. The electro-active polymer has characteristics for being utilized for a sensor due to large deformation and fast mechanical/electrical ductility reaction speed and a linear electrical reaction against a mechanical stimulus and has high flexibility and thus is suitable for the present invention. However, it is obvious that various electro-active polymer materials including PVDF may be used in the present invention.

According to the configuration of the sensor 200 having the above characteristics and fabric structure, because the sensor 200 is formed to have a shape of a fabric, the sensor has high flexibility and thus may also be installed in a location in which an existing sensor for sensing deformation information is not easily installed, i.e., in a structure having a large curvature so that limitation in installation places may be minimized.

Hereinafter, the structure of the sensor unit 210 that is a configuration unit of the above-described sensor 200 will be described in more detail.

Figure 10:
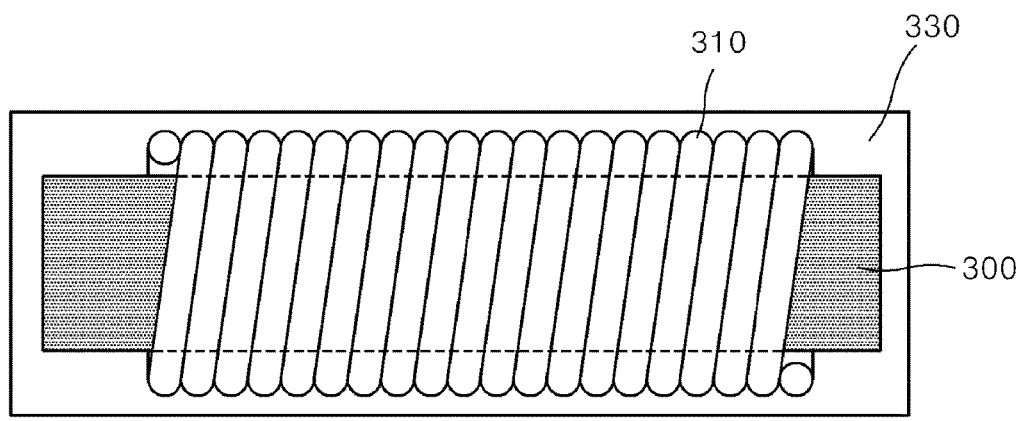
FIG. 10 illustrates an example of a lateral cross-sectional view of a sensor unit using an electro-active polymer for wireless transmission/reception of deformation information according to the second embodiment of the present invention.

FIG. 10 illustrates an example of a lateral cross-sectional view of a sensor unit using an electro-active polymer for wireless transmission/reception of deformation information according to the second embodiment of the present invention.

Figure 11:
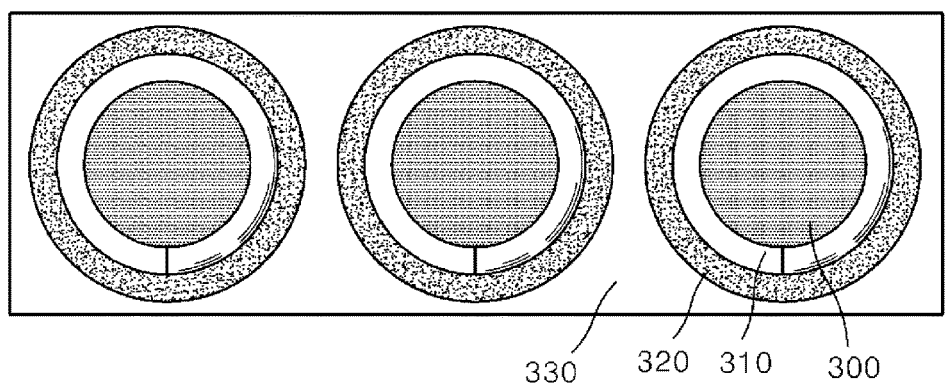
FIG. 11 illustrates an example of a cross-sectional view of a sensor unit using an electro-active polymer for wireless transmission/reception of deformation information according to another example of the second embodiment of the present invention.

Referring to FIGS. 10 and 11 together, the sensor unit mentioned in FIG. 9 may include a first electrode 300, a sensor part 310, and an insulating layer 330. Of course, as mentioned in descriptions of FIG. 11, a second electrode 320 that surrounds the sensor part 310 may be included in the sensor unit.

Basically, the configuration of the sensor unit is characterized by including the first electrode 300 and the sensor part 310. The first electrode 300 may have a shape of a fiber yarn, as illustrated in FIG. 10. Thus, the shape of the sensor unit is also the shape of the fiber yarn based on the first electrode 300, thereby constituting a sensor having the shape of a fabric, as illustrated in FIG. 9.

The sensor part 310 is configured to surround the first electrode 300 in the form of a coil and includes an electro-active polymer (EAP) material, such as PVDF, as mentioned above. The sensor part 310 is formed to surround the first electrode 300 in the form of the coil, wherein there is no gap in the coil shape, as illustrated in FIG. 10.

Meanwhile, because, as illustrated in FIG. 9, as the sensor unit 210 is woven such that the sensor units 210 come into contact with one another to constitute a fabric structure, the insulating layer 300 may surround outer surfaces of the first electrode 300 and the second electrode 320 that will be described later together with the sensor part 310 so that the first electrode 300 and the second electrode 320 that will be described later together with the sensor part 310 do not come into contact with each other. Thus, an electromagnetic field corresponding to a degree of deformation is precisely formed in a location in which deformation occurs, so that accuracy of sensing may be improved.

In FIG. 10, the sensor part 310 includes one sensor fiber to surround the first electrode 300 in the form of a coil. However, according to an embodiment of the present invention, the sensor part 310 may include a plurality of sensor fibers, wherein each of the plurality of sensor fibers surrounds the first electrode 300 in the form of the coil.

As mentioned above, in the present invention, the first electrode 300 and the sensor part 310 may be configured in the form of a fiber yarn. Thus, the sensor unit also has a shape of the fiber yarn so that the sensor unit is woven, as mentioned in the descriptions of FIG. 9 and thus a sensor having a fabric structure of fiber may be manufactured.

FIG. 11 illustrates an example of a cross-sectional view of a sensor unit using an electro-active polymer for wireless transmission/reception of deformation information according to another example of the second embodiment of the present invention.

FIG. 11 includes a similar configuration to that of FIG. 10. Compared to FIG. 10, in FIG. 11, the second electrode 320 is included. The second electrode 320 is configured to receive electrical energy generated by the sensor part 310 together with the first electrode 300 and to form a larger electromagnetic field and to transmit the electromagnetic field to the outside.

In this case, as illustrated in FIG. 11, one sensor unit may include a plurality of first electrodes 300 and a plurality of second electrodes 320. Of course, as mentioned above, for sensing accuracy, the plurality of second electrodes 320 may be insulated from one another by the insulating layer 330.

Of course, illustration of FIG. 10 may be applied to the example of FIG. 11. That is, as mentioned in the descriptions of FIG. 10, one first electrode 300, one sensor part 310, and one second electrode 320 may form a sensor unit. Even in this case, the insulating layer surrounds the second electrode 320 so that, even when the sensor units do not come into contact with one another due to the fabric structure illustrated in FIG. 9, the adjacent second electrodes 320 of a sensor unit may be insulated from each other. In the present invention, the insulating layer 330 may be formed of an elastic body due to features of the fabric structure and features of an installation place of the sensor. However, embodiments are not limited thereto.

The second electrode 320 having the same configuration as that of the sensor part 310 may be formed to surround the sensor part 310 in the form of a coil but may also be formed by applying an electrode material to the sensor part 310.

According to the above structure, because, in the sensor unit, the sensor part 310 forms the sensor unit by surrounding the first electrode 300 in the form of the coil, efficiency of forming electrical energy and an electromagnetic field may be greatly increased, and a large electromagnetic field may be transmitted even in small deformation so that limitations in an installation location of a sensor for sensing deformation information in a wireless and powerless manner and a measurement location of a measuring device may be overcome.

Figure 12:
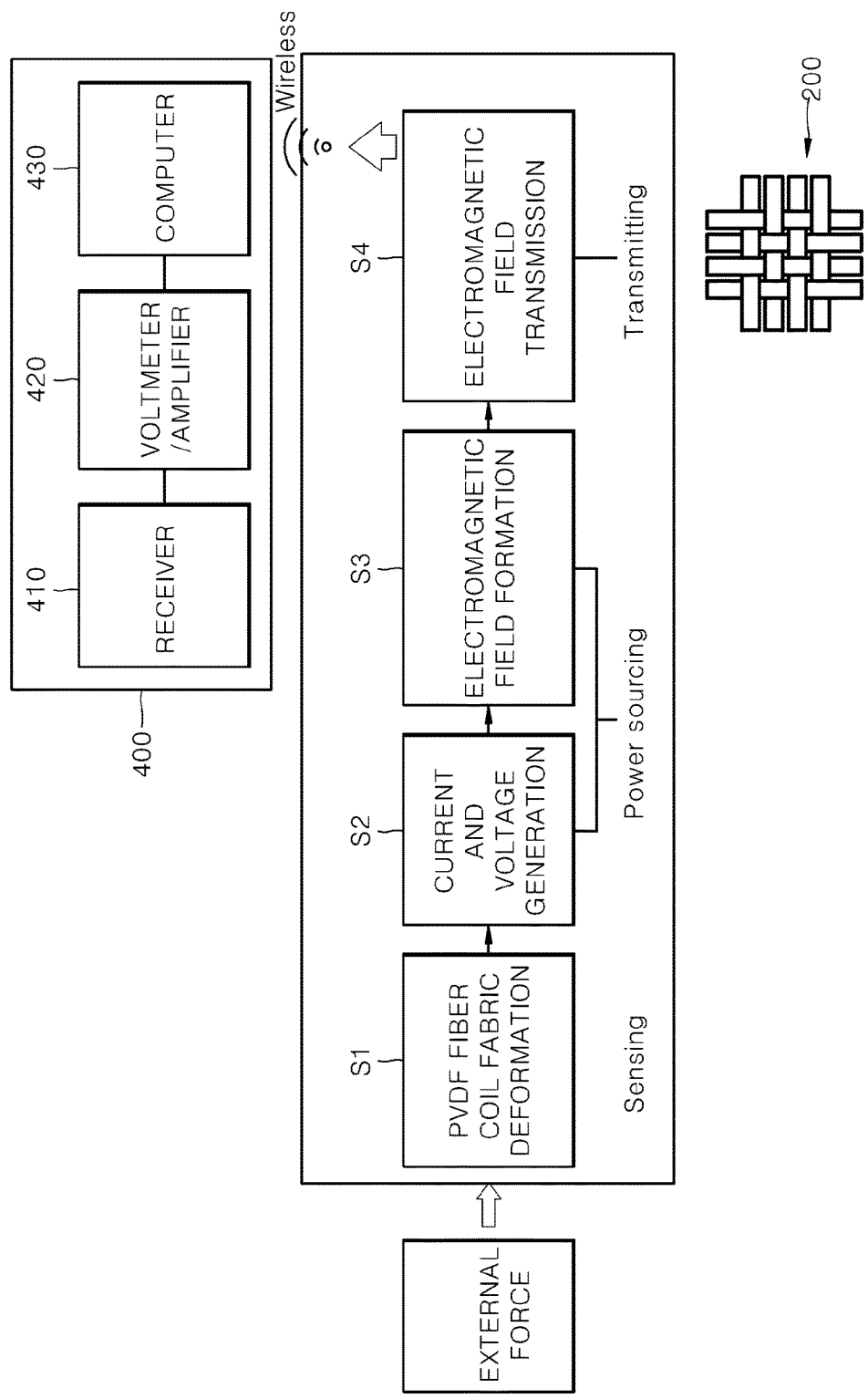
FIG. 12 is a view for describing the flow in which deformation information is measured, according to the second embodiment of the present invention.

FIG. 12 is a view for describing the flow in which deformation information is measured, according to the second embodiment of the present invention.

First, when external shock and deformation occur in the sensor 200, an external force is applied to the sensor 200, and mechanical deformation occurs in the sensor 200 (S1). That is, deformation occurs in a sensor part including an electro-active polymer material, i.e., a fabric including a coil structure.

In this case, due to characteristics of the electro-active polymer material, a current and a voltage, i.e., electrical energy is generated in the sensor 200 (S2). In this case, the electrical energy is transmitted to the outside in a powerless manner so that deformation information may be remotely measured.

In the above procedure, an electromagnetic field is formed by the electrode included in the sensor 200 formed to have a coil shape (S3), and simultaneously, the electromagnetic field is also formed outside the sensor 200 due to the electrode so that the electromagnetic field may be transmitted to the outside (S4).

A manager may receive the electromagnetic field transmitted by a receiver 410 in an adjacent location to a location in which the sensor 200 is installed, for example, in a location in which the electromagnetic field formed and transmitted in Operation S4 may be sensed by the receiver 410 included in a sensing device 400, and may measure the deformation information using the electromagnetic field received using a voltmeter/amplifier 420 and a computer 430.

In this structure, because the wireless/powerless sensor 200 includes the structure mentioned in the descriptions of FIGS. 9 through 3, the intensity of the electromagnetic field generated by the external force may be large. Thus, efficiency of forming electrical energy and the electromagnetic field is greatly increased, and a large electromagnetic field may be transmitted even in small deformation so that limitations in an installation location of the sensor 200 for sensing deformation information in a wireless and powerless manner and a measurement location of a measuring device may be overcome.

[Third Embodiment]

Figure 13:
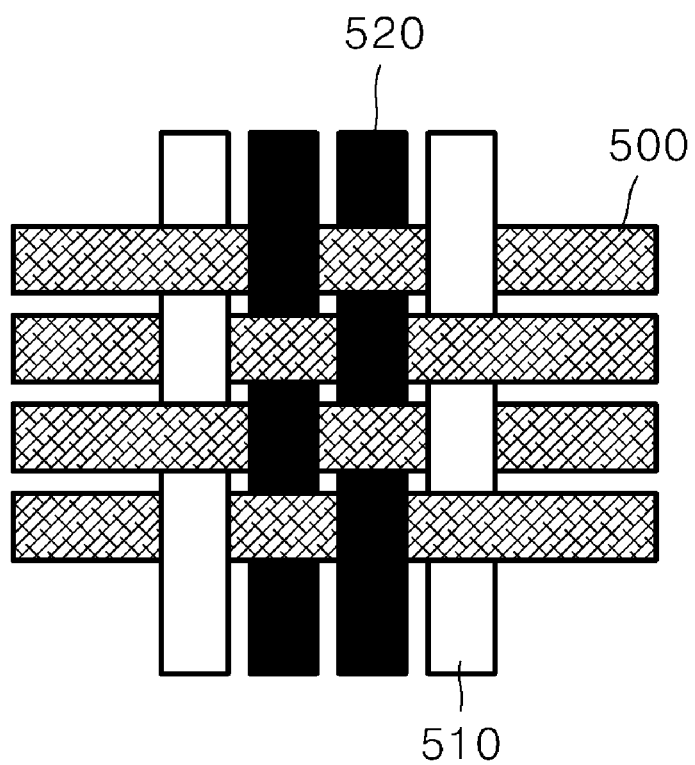
FIG. 13 is a view of a structure of a sensor using an electro-active polymer for wireless transmission/reception of deformation information according to a third embodiment of the present invention.

FIG. 13 is a view of a structure of a sensor using an electro-active polymer for wireless transmission/reception of deformation information according to a third embodiment of the present invention.

Referring to FIG. 13, the sensor using the electro-active polymer for wireless transmission/reception of deformation information according to the third embodiment of the present invention may include a first fiber 500 and a second fiber 510 and may further include a third fiber 520.

The first fiber 500 refers to at least one fiber group including an electro-active polymer material. The electro-active polymer material means all materials having features of generating a voltage when the electro-active polymer material is deformed by an external force. For example, the first fiber 500 may include an electro-active polymer material based on PVDF that works by a relaxor ferroelectric mechanism. However, embodiments are not limited thereto, and the first fiber 500 may include any material that may generate power due to an external force and may be restored to its original state when the external force is removed from the first fiber 500.

The second fiber 510 includes a flexible fiber including a conductive material and may be understood as an electrode. The second fiber 510 may include a material having high electrical conductivity and low specific resistance and means at least one fiber group, like in the first fiber 500.

The second fiber 510 has excellent durability and ductility not to be damaged by the external force, such as compression, tension, a bending force, etc. and simultaneously has high elasticity and extensibility and thus has to secure flexibility together with the first fiber 500.

The second fiber 510 may include a metal wire, such as copper or gold, for example, or may include a material such as a polyethylenedioxythiphene (PEDOT)-based conductive polymer and a carbon fiber. In this case, an elastomer material for securing elasticity together with a conductive polymer material may be mixed in the second fiber 510.

For example, when xylitol that is a kind of sugar alcohol is added to the conductive polymer material, an electrode having excellent elasticity and extensibility may be manufactured. For example, PEDOT:PSS may be used as the conductive polymer material.

When PEDOT:PSS is applied in the form of a thick film having 50 um or more, the flexibility of PEDOT:PSS is decreased, and PEDOT:PSS may have brittleness due to hydrogen bond between sulfonic acid groups of PSS that exits on the surface of colloid particles. To this end, an elastomer material powder such as xylitol having a predetermined ratio (for example, 50 wt % of PEDOT:PSS) is added to PEDOT:PSS, and several post-processing including thermal treatment is performed so that an electrode that is flexible and has excellent elasticity may be manufactured.

Meanwhile, in order to secure larger electrical conductivity of the second fiber 510, a conductive powder layer having high electrical conductivity, such as carbon black, carbon nanotubes (CNTs), graphene, etc., may be coated on the surface of the second fiber 510 or mixed with the second fiber 510. Of course, the conductive powder layer formed on a surface layer of the second fiber 510 is not limited to the above example.

Of course, except for the above example, it is obvious that a flexible electrode fiber having secured flexibility may be used as the second fiber 510.

In the present invention, as illustrated in FIG. 13, the first fiber 500 and the second fiber 510 are woven in the form of a fabric. For example, the first fiber 500 and the second fiber 510 are woven in various fabric shapes including plain weave, twill, and satin so that a sensor having a fabric structure with excellent adaptability against deformation may be manufactured.

A plain weave structure has a problem in that, due to comparatively many cross points, the shape of the plain weave structure is deformed by an external force and then is delayed to be restored to its original state compared to a twill or satin structure. Meanwhile, the twill structure has weak rigidity due to smaller cross points than those of the plain weave structure, but is soft and less wrinkles do not occur than the plain weave structure or the satin structure and thus has an excellent restoration force corresponding to deformation.

Thus, various structures (a configuration for combining structures) may be used by combining the above-described structures according to the type of an external force applied to a structure in which a sensor is installed, conditions of an external environment. Also, except for a two-dimensional fabric structure, all general shapes of fabrics such as a three-dimensional shell structure and a spherical structure may be applied.

Meanwhile, as illustrated in FIG. 13, the third fiber 520 may be additionally included. The third fiber 520 includes an electrical insulating material and refers to fiber having the same flexibility as those of the first fiber 500 and the second fiber 510.

The third fiber 520 may be woven so that it may cross the first fiber 500 and the second fiber 510 together, thereby forming a fabric structure. In particular, in order to prevent malfunction caused by a contact between the second fibers 510, the third fiber 520 may be formed to have a fabric shape to prevent a contact between the second fibers 510 by the third fiber 520.

When the first fiber 500 is deformed by an external force, electrical energy is generated, and electrical energy is generated with high efficiency by an interaction between the first fiber 500 and the second fiber 510. The size of the generated electrical energy varies according to a degree of deformation of the first fiber 500, and when the value of the size of the electrical energy is analyzed using a wired/wireless method, a value of the degree of deformation may be measured.

In this case, according to an embodiment of the present invention illustrated in FIG. 13, when a fiber layer formed of an electro-active polymer material and a flexible conductive fiber layer may be woven in the form of a fabric and used as a sensor, deformation information may be precisely measured without losing functionality in addition to various types of external forces and simultaneously, the sensor may be installed without limitations in various places, such as a surface of a structure with a large curvature, a wearable device, etc., so that a degree of freedom of installation in which the sensor may be installed anywhere in which appearance deformation measuring technology is required.

Figure 14:
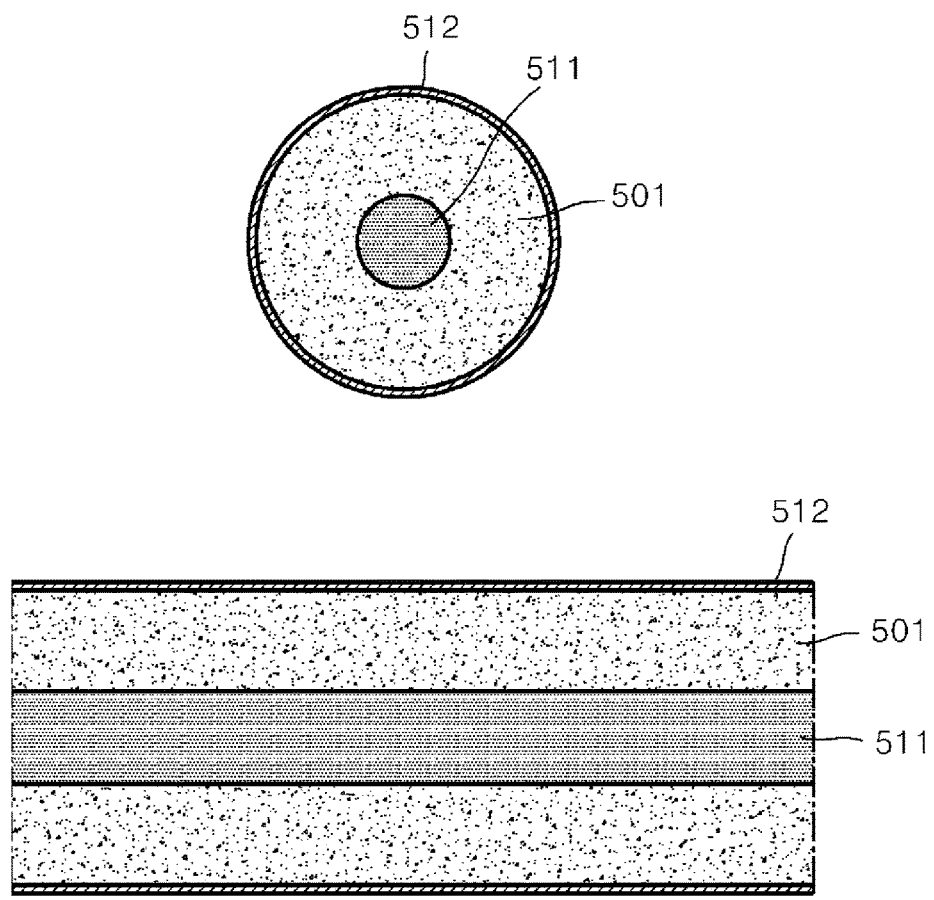
FIG. 14 is a view of a structure of a sensor using an electro-active polymer for wireless transmission/reception of deformation information according to another example of the third embodiment of the present invention.

FIG. 14 is a view of a structure of a sensor using an electro-active polymer for wireless transmission/reception of deformation information according to another example of the third embodiment of the present invention.

Referring to FIG. 14, a fibrous body included in the sensor using the electro-active polymer for wireless transmission/reception of deformation information according to another example of the third embodiment of the present invention is characterized by including a first fiber layer 501 and second fiber layers 511 and 512. The fibrous body is woven in various fabric shapes mentioned in the descriptions of FIG. 13, thereby constituting a fabric sensor. Also, detailed features of the first fiber layer 501 and the second fiber layers 511 and 512 are the same as those of the descriptions of the first fiber and the second fiber in the descriptions of FIG. 13 and thus will be omitted.

The example of FIG. 14 of the present invention is characterized in that the first fiber layer 501 and the second fiber layers 511 and 512 are included in one fibrous body, unlike in the example of FIG. 13.

That is, the second fiber layer 511 as an electrode may be inserted into the first fiber layer 501 formed of an electro-active polymer material, or the second fiber layer 512 may be formed on the surface of the first fiber layer 501.

Such a fibrous body may be woven in the form of a fabric, thereby performing the same function as that of the example of FIG. 13. Of course, in the example in which the second fiber layer 512 is applied onto the surface of the first fiber layer 501, an electrical insulating material may be applied to the second fiber layer 512 or placed between fibrous bodies together with the third fiber of FIG. 13 so that a contact between the second fiber layers 512 that is a conductive material may be prevented.

Figure 15:
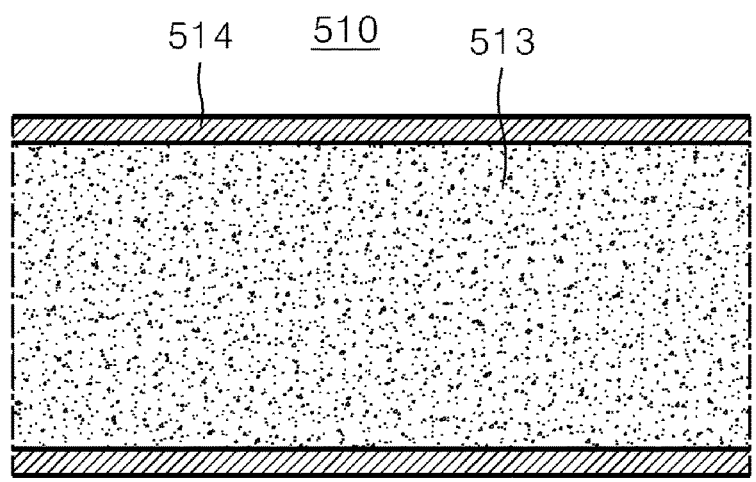
FIG. 15 illustrates an example of a lateral cross-sectional view of a second fiber layer for implementing the third embodiment of the present invention.

FIG. 15 illustrates an example of a lateral cross-sectional view of a second fiber layer for implementing the third embodiment of the present invention.

As mentioned in the descriptions of FIG. 13, the second fiber 510 may include conductive fiber 513 including a conductive polymer material and an elastomer and a conductive powder layer 514 for improving electrical conductivity.

Through the structure of FIG. 15, as mentioned in FIG. 13, an electrode having secured flexibility may be manufactured, and simultaneously, an electrode having high efficiency in terms of electrical conductivity may be generated so that an electrode structure suitable for characteristics of a fabric sensor of the present invention may be provided.

Figure 16:
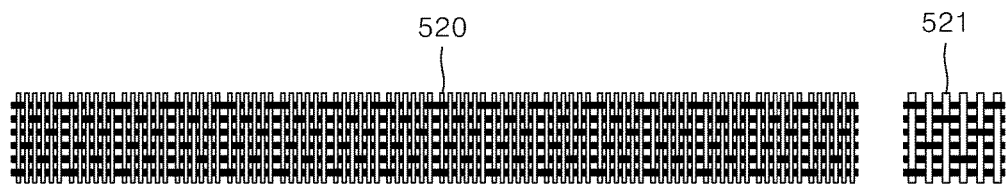
FIG. 16 illustrates an example of a shape of a sensor that may be implemented according to the third embodiment of the present invention.

FIG. 16 illustrates an example of a shape of a sensor that may be implemented according to the third embodiment of the present invention.

As illustrated in FIG. 16, the sensor having a fabric shape may be woven in various shapes including a strip type sensor 520 and a patch type sensor 521. As mentioned in FIGS. 13 through 14, an electro-active polymer material and an electrode may be woven in the form of a fabric so that the sensor may be manufactured in the form of a fabric having various shapes according to weaving.

Thus, a sensor for sensing deformation information having very excellent adaptability to a structure formed in various shapes, a wearable device applied to the human body, etc. may be manufactured, and deformation information sensing may be used in various fields.

[Fourth Embodiment]

Figure 17:
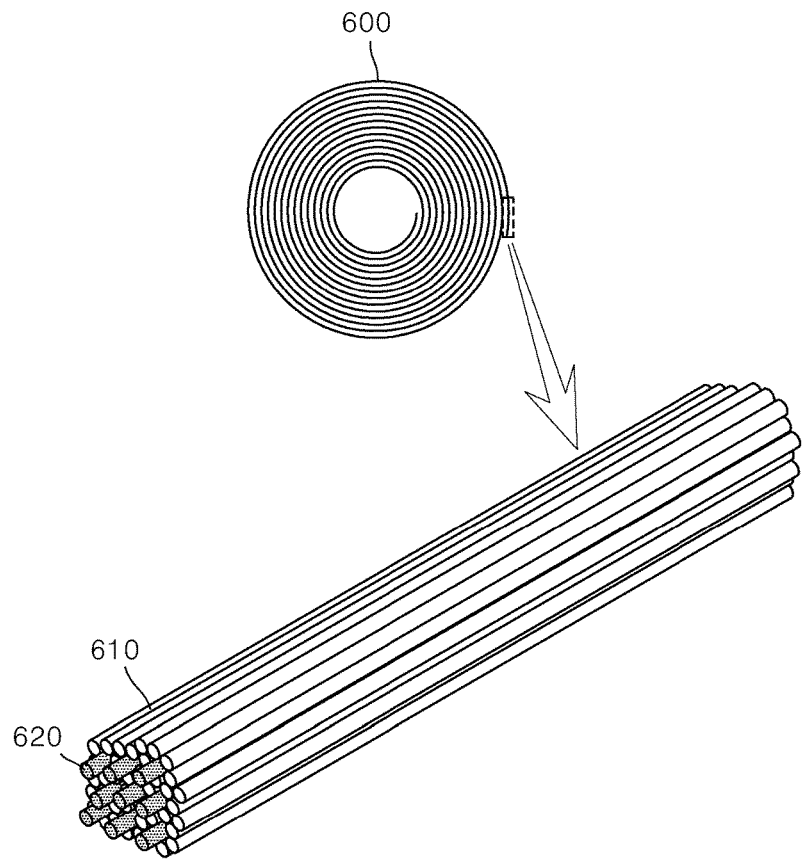
FIG. 17 is a view of a fiber coil of a sensor using an electro-active polymer for wireless transmission/reception of deformation information according to a fourth embodiment of the present invention and an enlarged view of a part of the fiber coil.
Figure 18:
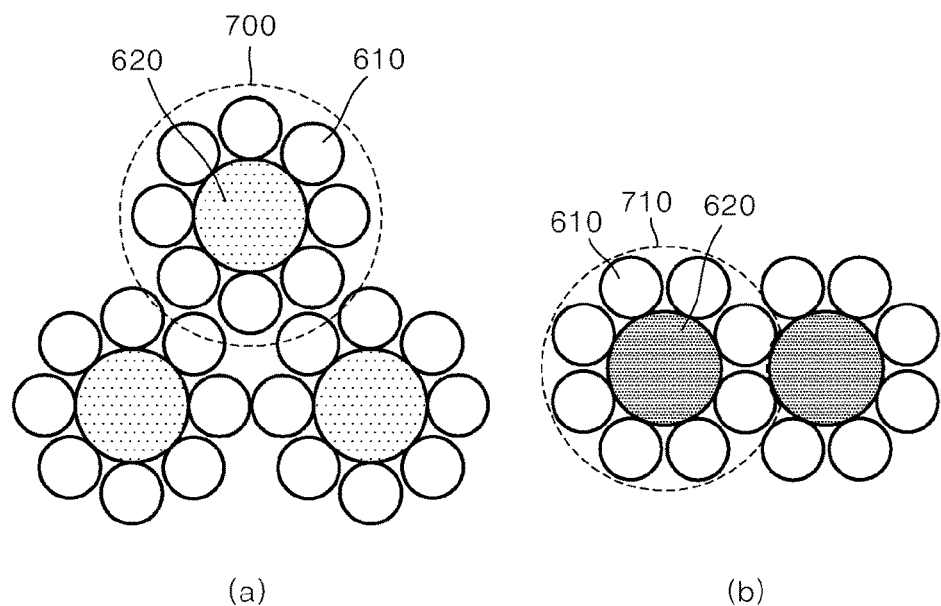
FIG. 18 is a view of a part of a cross-sectional structure of the fiber coil for implementing the fourth embodiment of the present invention.

FIG. 17 is a view of a fiber coil of a sensor using an electro-active polymer for wireless transmission/reception of deformation information according to a fourth embodiment of the present invention and an enlarged view of a part of the fiber coil, and FIG. 18 is a view of a part of a cross-sectional structure of the fiber coil for implementing the fourth embodiment of the present invention.

First, referring to FIG. 17, the sensor using the electro-active polymer for wireless transmission/reception of deformation information according to an embodiment of the present invention (hereinafter, referred to as a sensor) includes a fiber coil 600 having a coil-shaped fibrous body including first fiber 610 including an electro-active polymer material in which a voltage is generated when the first fiber 610 is deformed by an external force and second fiber 620 that is fiber including a conductive material to which the voltage generated in the first fiber 610 may be applied, and a capacitor (not shown) connected to both ends of the fiber coil 600.

In the fourth embodiment, when deformation occurs in the fiber coil 600 by an external force, due to piezoelectric characteristics of the fiber coil 600, power may be generated in the first fiber 610. When the generated power (for example, a voltage) is applied to the second fiber 620, the voltage is charged in or discharged from the capacitor using the second fiber 620 so that a current flows through the second fiber 620, and the second fiber 620 forms a coil structure, like in the fiber coil 600, so that an electromagnetic field may be formed by the current flowing through the second fiber 620.

In the fourth embodiment, the first fiber 610 may include the electro-active polymer material. For example, the first fiber 610 may include an electro-active polymer material based on PVDF that works by a relaxor ferroelectric mechanism. However, embodiments are not limited thereto, and any material that may generate power by an external force and may be restored to its original state when the external force is removed from the first fiber 610, may be used for the first fiber 610.

In the fourth embodiment, the second fiber 620 may be understood as an electrode. For example, when the voltage generated by the first fiber 610 is applied to the second fiber 620, the voltage is charged in or discharged from the capacitor connected to the second fiber 620 and thus, a current may flow through the second fiber 620. When the current flows through the second fiber 620, an electromagnetic field is generated by the coil structure.

In the fourth embodiment, the second fiber 620 may include a material having high electrical conductivity and low specific resistance. In another example of the fourth embodiment, the second fiber 620 may include a material having excellent durability and ductility not to be damaged by an external force applied thereto, such as compression, tension, a bending force, etc. For example, the second fiber 620 may include a conductive material, such as a metal, for example, copper or gold, or polymer having conductivity. However, embodiments are not limited thereto, and all materials that perform the above-described function may be used.

Referring to FIG. 18, the first fiber 610 of the fiber coil 600 may be disposed to surround the second fiber 620. When there are a plurality of second fibers 620 that constitute the fiber coil 600 for improvements in power generation efficiency and electromagnetic field generation efficiency, the fiber coil 600 may include at least one unit fibrous body 700 and 710 that is a unit body formed so that the second fibers 620 are electrically spaced apart from each other. For example, the fiber coil may be configured to include a plurality of unit fibrous bodies 700 and 710 in which the unit fibrous bodies 700 and 710 are a unit.

In the fourth embodiment, the unit fibrous bodies 700 and 710 may be formed as a combination of the first fiber 610 and the second fiber 620 that are independent from each other, like in the unit fibrous body 700 of (a) of FIG. 18. In another example of the fourth embodiment, the unit fibrous bodies 700 and 710 may be formed so that the adjacent unit fibrous body 710 may share a part of the first fiber 610, like in the unit fibrous body 710 of (b) of FIG. 18.

In the fourth embodiment, in order to induce a piezoelectric effect of the first fiber 610 as well as the second fiber 620, an electrical conductive material (not shown) may be applied or coated to outer walls (not shown) of the unit fibrous bodies 700 and 710.

Figure 19:
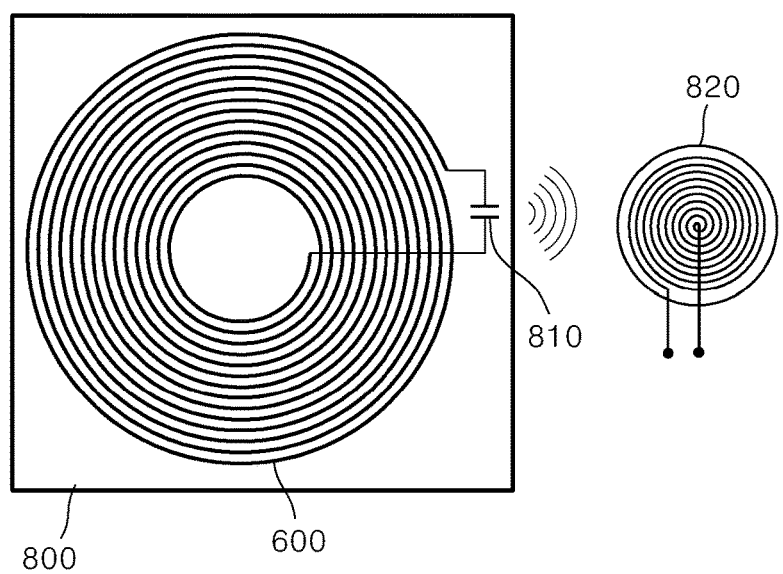
FIG. 19 is a partial configuration view of a system for monitoring soundness of a structure according to the fourth embodiment of the present invention.
Figure 20:
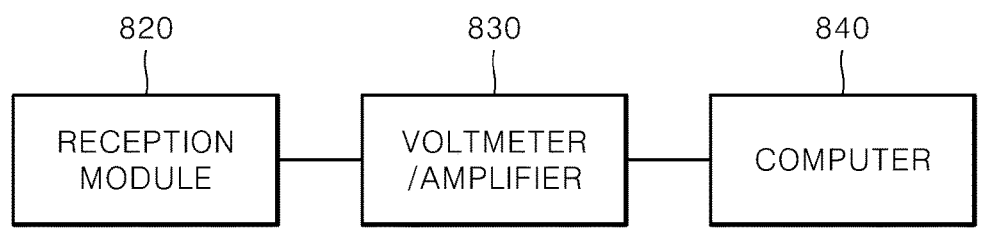
FIG. 20 is a configuration view of a reader of the system for monitoring soundness of the structure according to the fourth embodiment of the present invention.
Figure 21:
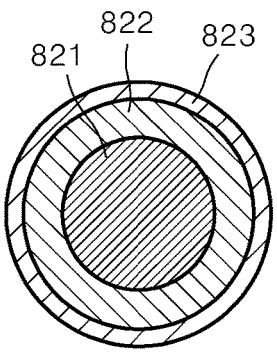
FIG. 21 is a view of a cross-section of a coil included in a reception module of the system for monitoring soundness of the structure according to the fourth embodiment of the present invention.

FIG. 19 is a partial configuration view of a system for monitoring soundness of a structure according to the fourth embodiment of the present invention, FIG. 20 is a configuration view of a reader of the system for monitoring soundness of the structure according to the fourth embodiment of the present invention, and FIG. 21 is a view of a cross-section of a coil included in a reception module of the system for monitoring soundness of the structure according to the fourth embodiment of the present invention.

For example, FIG. 19 is a view for describing a function in which data for calculating deformation information of a structure are generated and transmitted, according to the fourth embodiment of the present invention, FIG. 20 is a view for describing the configuration of a reader that performs a function for calculating deformation information of the structure by receiving an electromagnetic field when the electromagnetic field is generated, and FIG. 21 is a view illustrating a schematic cross-sectional structure of the reception module for receiving the electromagnetic field.

As described in FIGS. 19 through 21, the system for monitoring soundness of the structure according to the fourth embodiment of the present invention includes a sensor module 800 including at least a fiber coil 600 and a capacitor 810, and a reader (not shown) including a reception module 820 and a processor (not shown).

Referring to FIG. 19 based on this, the capacitor 810 may be connected to both ends of the fiber coil 600. In one embodiment, the fiber coil 600 and the capacitor 810 may be surrounded by a waterproof polymer such as polydimethylsiloxane (PDMS). In one embodiment, the fiber coil 600 and the capacitor 810 may be implemented to have a diameter of 5 mm or less.

In the fourth embodiment, when deformation occurs in the fiber coil 600 by an external force, due to the above-described function and action, power may be formed in the fiber coil 600. As mentioned above, in the fourth embodiment, the fiber coil 600 includes an electrode so that the fiber coil 600 itself serves as concentric flat solenoid, and when a current passes through the fiber coil 600, an electromagnetic field is formed, and the formed electromagnetic field is transmitted to the outside.

In the fourth embodiment, the reception module 820 included in the system for monitoring soundness of the structure performs a function of receiving the electromagnetic field formed in the sensor, as described above.

The reception module 820 may receive the electromagnetic field formed from the sensor and transmitted. When the electromagnetic field formed from the sensor and transmitted is applied to the reception module 820, an electromagnetic induction phenomenon occurs to the applied electromagnetic field and the structure of the reception module 820 (for example, a configuration wound in a coil structure).

In the fourth embodiment, the reception module 820 may be placed at a distance at which the electromagnetic field formed from the sensor and transmitted may be applied to the reception module 820. In another example of the fourth embodiment, the reception module 820 may include reception coils (a conductive material of the coil structure) so as to convert the electromagnetic field into at least one of a current and a voltage value when the electromagnetic field is applied to the reception module 820. Meanwhile, when the reader including the reception module 820 is manufactured to be portable, the reception module 820 may also be moved. In this case, a manager places the reader at a distance at which the electromagnetic field formed from the sensor and transmitted may be applied. In this case, the electromagnetic field is applied to the reception module 820. That is, the manager places the reader in a desired location (a location in which deformation information are to be measured) at a desired time so that the generated electromagnetic field may be received by the reception module 820.

In the fourth embodiment, the reception coils of the reception module 820 may include at least one of a winding 821, a winding 822, and a winding 823. The winging 822 applied to the winding 821 is a configuration for improving wireless power transmission efficiency by minimizing the electromagnetic field generated by the sensor and an electromagnetic field leaking between the reception coils included in the reception module 820. The winding 822 may include a material such as ferrite. However, embodiments are not limited thereto. The winding 823 includes a material such as PDMS, as mentioned above, to protect the reception coils from an external environment such as moisture.

When the electromagnetic field is applied to the reception module 820, due to the coil structure such as the reception coils mentioned in FIG. 21, a current and a voltage will be applied to the reception module 820.

The voltmeter and amplifier 830 may measure the current and the voltage applied to the reception module 820. A computer 850 may calculate the measured value as deformation information.

In the fourth embodiment of the present invention, the voltmeter and amplifier 830 and the computer 850 may be included in one processor. That is, the processor performs a function of calculating deformation information caused by an external force of a region in which a sensor for sensing deformation using an electro-active polymer material is installed, using the magnitude of the current and voltage applied to the reception module 820 according to the magnitude of the electromagnetic field received by the reception module 820.

Meanwhile, in another example of the fourth embodiment of the present invention, the amplifier 830 may be included in the reception module 820 that is not the processor. Any type of amplifier 830 that amplifies the electromagnetic field received by the reception module 820 to convert the value of the electromagnetic field amplified by the reception module 820 into a voltage and current voltage or performs a function of amplifying the voltage and current value converted by the reception module 820 may be used. In this case, the processor may be understood as a configuration that refers to the computer 850.

In the fourth embodiment of the present invention, the fiber coil emits the electromagnetic field using power generated by a change caused by the external force of the electro-active polymer material. The magnitude of the emitted electromagnetic field may be very small. Thus, the electromagnetic field is amplified by the reception module 820 included in the reader or the processor so that a degree of deformation of the structure may be more precisely measured.

According to the above-described configuration, a power supply module and a wired structure that have to be essentially connected to an existing deformation sensing sensor installed to calculate an external force directly, and a communication module may be replaced with an ultra-small fiber coil. That is, because the fiber coil includes an electro-active polymer material, an electrode and a capacitor, a voltage is generated when an external force is applied to the fiber coil. Thus, a current is applied to the electrode, and an electromagnetic field is generated in the coil due to the current. That is, because electromagnetic fields having different sizes are generated according to a degree of deformation of the fiber coil caused by the size of the external force without the supply of the current, data for calculating deformation information are generated in a powerless state, a non-communication module state and a wireless state.

Through the above-described function and action, according to the fourth embodiment of the present invention, a system having a very small size may be implemented compared to an existing system for monitoring soundness of a structure so that installation may be easily performed in the structure and no additional power supply unit or communication module is required and thus installation costs and maintenance costs may be reduced.

It will be interpreted that the terms "comprises" and/or "comprising" used herein, unless the context clearly indicates otherwise, specify the presence of a corresponding element but do not exclude another element but specify addition of another element. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The forgoing is illustrative of exemplary embodiments and is not to be construed as limiting thereof. Although exemplary embodiments have been described, one of ordinary skill in the art will readily appreciate that many modifications are possible in exemplary embodiments without materially departing from the novel teachings and advantages of exemplary embodiments. Accordingly, all such modifications are intended to be included within the scope of the claims. Therefore, it is to be understood that the foregoing is illustrative of exemplary embodiments and is not to be construed as limited to the specific embodiments disclosed, and that modifications to the disclosed embodiments, as well as other embodiments, are intended to be included within the scope of the appended claims. Exemplary embodiments are defined by the following claims, with equivalents of the claims to be included therein.

The invention claimed is:

1. A sensor unit using an electro-active polymer for wireless transmission/reception of deformation information, the sensor unit comprising:
   a first sensor part having a fiber or a film shape and comprising a ferroelectric electro-active polymer material;
   a second sensor part configured to include the first sensor part in a matrix comprising a dielectric elastomer electro-active polymer material; and
   an electrode part configured to come into contact with the first sensor part or the second sensor part, and when an external force is applied to the first sensor part or the second sensor part, to transmit to an outside an electric signal generated by the first sensor part or the second sensor part, wherein the first sensor part includes a plurality of fiber bundles, and the plurality of fiber bundles surround a part of the electrode part.

2. The sensor unit of claim 1, wherein the part of the electrode part is inserted into the first sensor part.

3. The sensor unit of claim 1, wherein directions of the external force, by which the first sensor part and the second sensor part generate the electric signal, are different from each other.

4. The sensor unit of claim 1, wherein the first sensor part includes a stack of a plurality of films.

5. The sensor unit of claim 1, wherein the sensor unit has a fiber shape to constitute a sensor.

* * * * *